United States Patent [19]

Stalley et al.

[11] 4,014,598

[45] Mar. 29, 1977

[54] COMPONENT CABINET

[75] Inventors: Anthony Donald Stalley, Fleet; Alan Martin Bishop, Newbury, both of England

[73] Assignee: Quantel Limited, England

[22] Filed: May 5, 1975

[21] Appl. No.: 574,841

[30] Foreign Application Priority Data

May 6, 1974 United Kingdom ......... 19846/74

[52] U.S. Cl. .............................. 312/236; 312/213; 312/256; 312/320; 165/121
[51] Int. Cl.² .................. A47B 77/08; A47B 81/00
[58] Field of Search .......... 312/236, 213, 320, 255, 312/256; 165/121, 169, 170

[56] References Cited

UNITED STATES PATENTS

| 918,742 | 4/1909 | Ferdon | 312/213 |
|---|---|---|---|
| 1,533,863 | 4/1925 | Johnson | 312/236 |
| 2,522,322 | 9/1950 | Wallace | 312/256 |
| 2,561,517 | 7/1951 | Ladge | 312/236 |
| 2,654,583 | 10/1953 | Treanor | 165/121 |
| 2,774,808 | 12/1956 | Bullock | 312/213 |
| 3,098,686 | 7/1963 | Benoit | 312/320 |
| 3,184,275 | 5/1965 | Gardner | 312/213 |
| 3,189,938 | 6/1965 | Saunders | 312/320 |
| 3,211,507 | 10/1965 | Gamst | 312/255 |
| 3,299,664 | 1/1967 | Booth | 312/236 |
| 3,413,050 | 11/1968 | Sommers et al. | 312/320 |
| 3,506,322 | 4/1970 | Richards | 312/213 |

*Primary Examiner*—Paul R. Gilliam
*Assistant Examiner*—Victor N. Sakran
*Attorney, Agent, or Firm*—Dowell & Dowell

[57] ABSTRACT

A free standing component cabinet capable of being rapidly reconverted to allow rack mounting thereof. The cabinet comprises a frame normally used for rack mounting which frame includes front rear and side walls and front mounting flanges having holes therein for securing the frame when mounted in a rack. Detachable top and bottom panels enclose the frame. Detachable face plates are mounted one on each of the side walls and abut the front mounting flange. These face plates provide an air duct to allow air to pass from the frame interior to the rear of the cabinet via a vent hole provided in at least one of the side plates. A fan assists the passage of air through the cabinet.

2 Claims, 3 Drawing Figures

COMPONENT CABINET

BACKGROUND TO THE INVENTION

The invention relates to rack mounted frames for electronic circuitry and to their modification to enable them to be used as free standing frames.

It is known to house equipment in frames of modular form mounted on racks. The frames may be supplied in standard widths (e.g. 19 inches) and are constructed to slide into the racks and to be secured thereto by means of front mounting flanges.

An alternative method of housing components is to use free standing cabinets.

Often it is necessary to produce the same equipment in both forms i.e. in frames for rack mounting and in free standing cabinets, especially when the equipment forms part of a complete system only part of which may be purchased at any one time dependent on requirements.

A system is also known which provides an external cabinet for the frame so that the frame can be slid into the cabinet and secured thereto by means of the front mounting flanges. This system however has the disadvantage that the cabinet can add considerably to the cost, weight and bulk of the frame. Also when the frame contains components which produce heat e.g. power transistors or valves a closed cabinet will not allow sufficient cooling of these components.

OBJECTS OF THE INVENTION

An object of the invention is to provide a free standing cabinet which can be easily and rapidly converted to allow rack mounting thereof.

A further object of the invention is to provide a cabinet which will allow sufficient airflow over heat producing components to keep said components within their operating temperature range.

SUMMARY OF THE INVENTION

According to the invention there is provided a component cabinet comprising;

a. a frame having a vent hole in at least one of its side walls;

b. interconnecting members between said walls; and c. hollow box-like faceplate mounted one on each of said side walls;

d. at least one of said faceplate communicating with the frame interior via said vent hole to allow the passage of air through said frame and through the interior of said faceplate to the outside of said cabinet.

BRIEF DESCRIPTION OF THE DRAWINGS

The invention will now be described by way of example with reference to the accompanying drawings in which.

DESCRIPTION OF PREFERRED EMBODIMENTS

Figure 1:
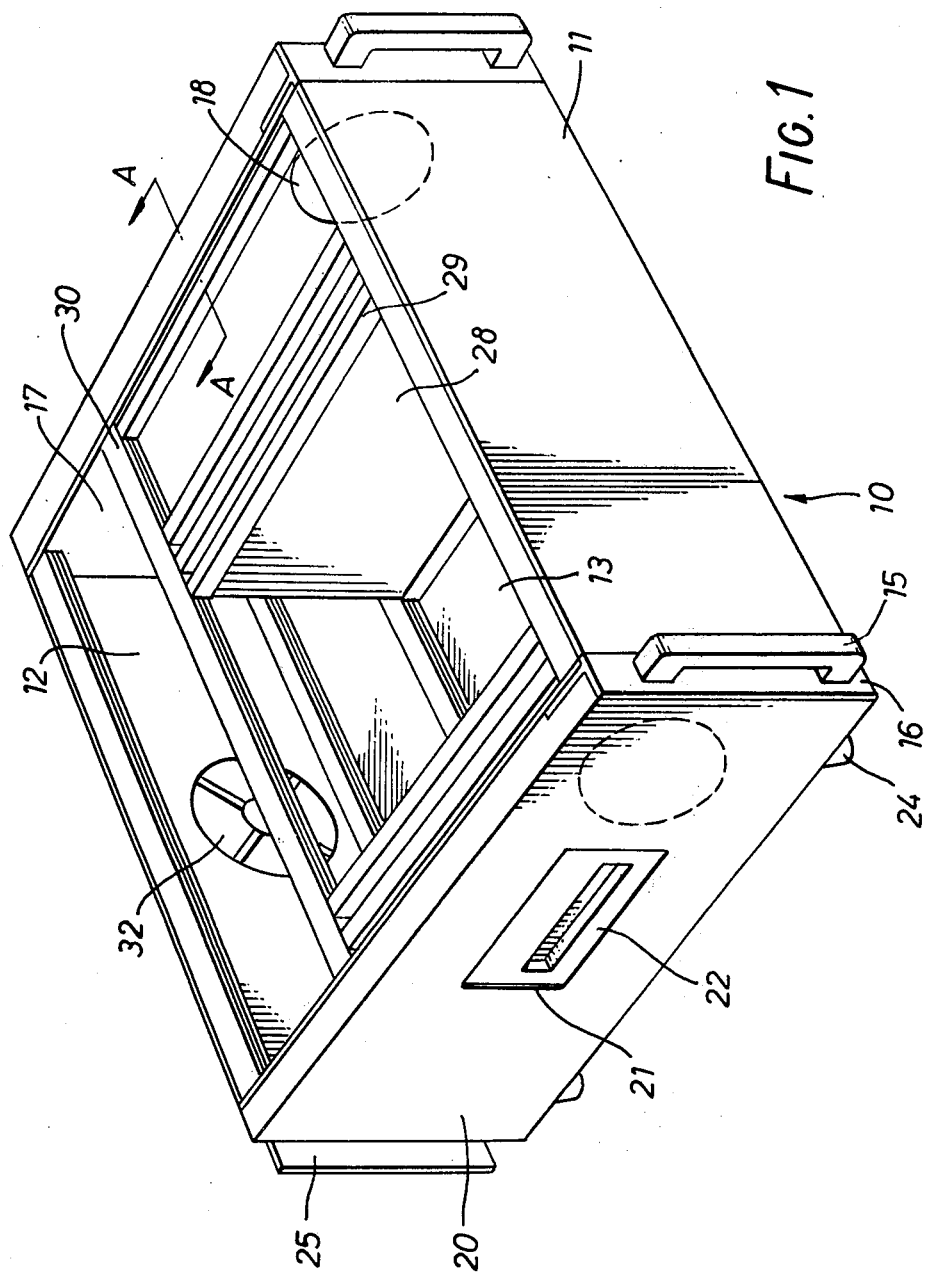
FIG. 1 shows a rack mounted frame modified according to the invention.

A standard 19 in. wide rack mounted frame 10 with front rear and bottom panels 11, 12 and 13 respectively is modified as shown in FIG. 1, the top panel being shown removed for the sake of clarity. The modified frame 10 includes handles 15 each attached to a front mounting flange 16. Each side panel 17 has been modified by providing a vent hole 18 therein. Both panels 17 have been further modified to accept an faceplate 20 attached thereto together with a carrying handle assembly 21 disposed within the faceplate which incorporates a handle 22 which can be folded flush relative to the faceplate when not required for carrying or lifting Rubber feet 24 are affixed to the bottom of the faceplate to support the frame when standing in the horizontal position.

Detachable rear guards 25 are fixed to the side panels to protect any protruding switches, plugs etc., which may protrude from the rear panel 12. Similarily, the front handles 15 provide protection for any switches etc., projecting from the front panel 11. The rear guards also provide support from the frame in the vertical position or when stood on its side, the flange 16 supporting the front of the frame in the latter position.

Components may be mounted on circuit boards 28 which are slideable on guide-rails 29 abutting a cross-rail 30. Electrical connection with other component boards etc., may be made by means of edge connectors (not shown).

Figure 2:
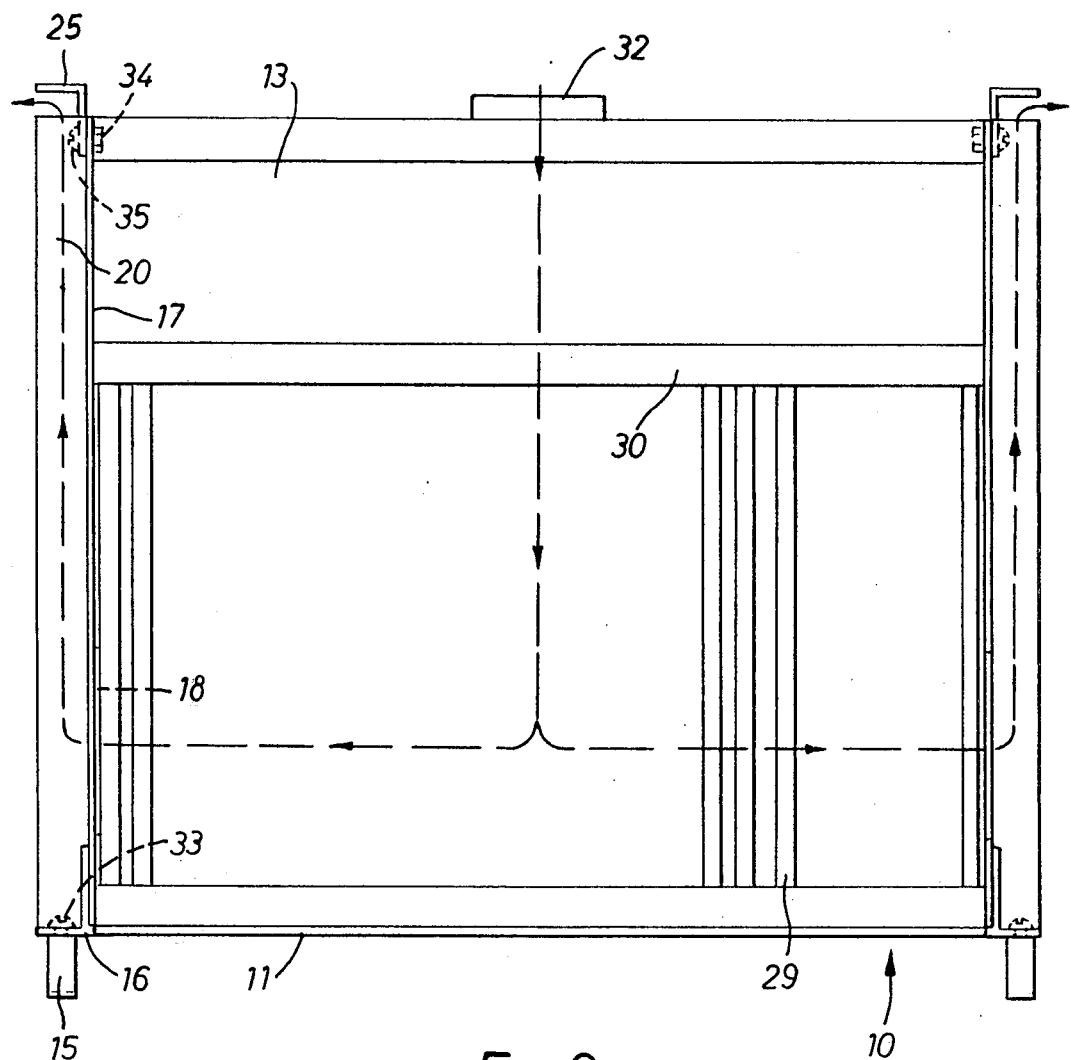
FIG. 2 is a plan view of the modified frame showing the airflow path.

When the frame contains components which produce heat e.g. valve, power transistors etc., means for cooling the equipment are required and the vent holes 18 provided in the side panels 17 allow the faceplate to be used as air ducts. A fan 32 with a built in filter is provided on the rear panel 12 and draws cool air into the interior of the frame and the air passes over the components (not shown) and out through the rear of faceplate 20 to the exterior as there are no open holes present in the side faces of the faceplate. This air flow path is shown dotted in FIG. 2, (with the top panel removed for the sake of clarity).

The handles 15 are attached for example by screws 33 to the front mounting flange 16 using holes normally used to fix the frame to a rack. The rear guards 25 may be fixed to the side panels 17 by means of nut 34 and screw 35.

Figure 3:
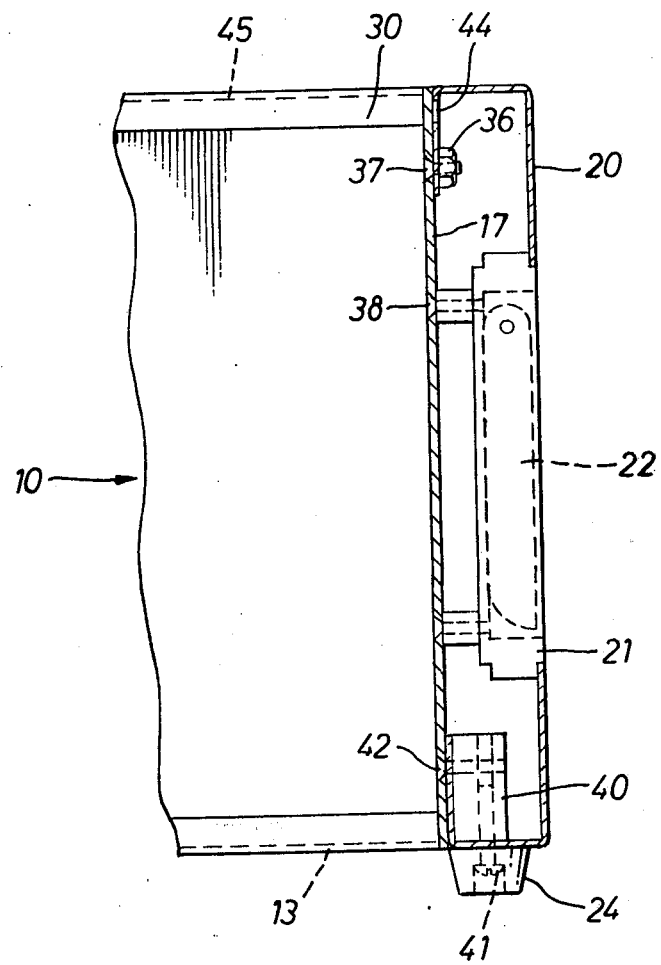
FIG. 3 is a detail of the cross section taken along the line A—A of FIG. 1.

FIG. 3 shows a sectional detail of the component parts of the faceplate 20 which is fixed to the side panel 17 by rivet nuts 36 and countersunk screws 37. The handle assembly 21 is also secured by countersunk screws 38. The faceplate 20 surrounds the handle assembly 21 to provide a substantially airtight seal therewith. A foot block 40 is incorporated which serves to provide fixing of the feet 24 by means of screws 41 and also to fix the faceplate to the side plate by means of a countersunk screw 42. The foot block also serves to transfer the frame weight to the feet. Clearance holes 44 are provided if fixing screws are used to secure cross-rail 30 to the side panel 17. Countersunk screws for fixing the faceplate are used so as to allow clearance from any components or plug-in boards housed in the frame.

The top and bottom panels 45 and 13 respectively lie within the boundaries of the front, side and rear panels so that fixing thereof is not hindered by the faceplate.

In order to convert the frame from free standing back to rack mounting, the screws 37 and 42 mounting the faceplate can be removed from the inside even when the frame contains components.

The screws 38 mounting the handle assembly 21 are likewise removed. The rear guards will also be removed and the handles 15 as required.

Access can be allowed for reaching the screws when layout is designed, or if plug-in boards 28 are used, then the necessary boards can be removed to gain temporary access and the boards then reinserted in their sockets. All fixings for the faceplate are concealed. The cooling system of the invention has the advantages that:

1. The frame can be stood on other equipment or other equipment placed immediately alongside or on top without any restriction in air-flow.

2. The rear guards deflect exhaust air to prevent recirculation into the cooling fan.

3. There is no direct access into the equipment (via louvres, etc.) through which foreign matter may enter to cause short circuits or other faults to occur. There is not direct access to the inside of the unit even when the fan is not in operation.

The frame is lightweight compared with known frames as by using the escutcheons, the use of any housing being avoided.

When the frame is not in use, the rear guards may be used to stow the mains cable by wraping it around both guards.

Although modification of the frame has been described relating to providing vent holes in each side panel it is still within the scope of the invention to provide a single vent hole in only one side panel in which case the fan can be located preferably to one side of the rear panel furthest away from the side panel with the vent hole therein, to provide a maximum air flow path through the frame.

We claim:

1. A free standing component cabinet capable of being rapidly reconverted to allow rack mounting thereof, said cabinet comprising:

a. a frame capable of being mounted in a rack and including front, rear and side walls and front mounting flanges affixed to said frame and extending laterally beyond said side walls and having holes therein for securing said frame to a rack when mounted therein, at least one of said side walls having a vent hole therein;
 b. detachable top and bottom panels enclosing said frame;
 c. detachable hollow face plates mounted one on each side of the frame and providing outside walls spaced from said side walls and abutting and lying flush with the lateral edges of said front mounting flanges to form with the side wall an air duct to allow air to pass from the frame interior through said vent hole, the rear of said hollow face plates being open to permit air to discharge to the rear of said cabinet;
 d. a fan mounted on said rear panel to assist the passage of air through said cabinet;
 e. a detachable front handle on each of said front mounting flanges, said handle being attached thereto be fixing means passing through the holes normally used for rack mounting; and
 f. rear guards extending from the rear of said side walls to provide protection for components projecting from said rear wall and to outwardly deflect exhaust air from said face plates to prevent recirculation of said air via the cooling fan.

2. A cabinet according to claim 1 wherein a foot block is provided at the front and rear of each of said face plates to provide means for detachably affixing said plates to said side walls, said foot blocks transferring the weight of said cabinet to feet attached thereto supporting said cabinet.

* * * * *